United States Patent
Li et al.

(10) Patent No.: US 6,797,540 B1
(45) Date of Patent: Sep. 28, 2004

(54) DAP ISOLATION PROCESS

(75) Inventors: Felix D. Li, San Jose, CA (US); Jaime A. Bayan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 164 days.

(21) Appl. No.: 10/299,464

(22) Filed: Nov. 18, 2002

(51) Int. Cl.[7] .......................... H01L 21/44; H01L 21/48; H01L 21/50
(52) U.S. Cl. ....................... 438/111; 438/112; 438/123; 438/124
(58) Field of Search ................................. 438/111–114

(56) References Cited

U.S. PATENT DOCUMENTS 6,531,765 B2 * 3/2003 Kinsman .................... 257/676

* cited by examiner

Primary Examiner—John F. Niebling
Assistant Examiner—Angel Roman
(74) Attorney, Agent, or Firm—Beyer Weaver & Thomas, LLP

(57) ABSTRACT

Methods of fabricating leadless packages are described that facilitate increased contact density. Each device area in a lead frame panel has a die attach pad and a multiplicity of conductive contacts. The contacts are carried by tie bars and the die attach pad is carried by support bars that extend from the contacts. During assembly, the lead frame panel is held in position while the die attach pad support bars are severed. Once the die attach pad support bars are severed, an adhesive tape is adhered to the bottom surface of the lead frame panel so that the die attach pad may be held in position relative to its associated contacts. After the adhesive tape has been applied, the leadless packages may be assembled in a conventional manner.

8 Claims, 4 Drawing Sheets

DAP ISOLATION PROCESS

BACKGROUND OF THE INVENTION

The present invention relates generally to the packaging of integrated circuits. More particularly, the invention relates to leadless packaging designs and processes.

A leadless lead frame package is an integrated circuit package design that contemplates the use of a lead frame in the formation of a chip scale package. The resulting packages are sometimes referred to as quad flat packs—no lead packages. As illustrated in FIGS. 1A–1C, in typical leadless lead frame packages, a copper lead frame strip or panel 101 is patterned (typically by stamping or etching) to define a plurality of arrays 103 of device areas 105. Each device area 105 includes a die attach pad 107 and a plurality of contacts 109 disposed about their associated die attach pad 107. Very fine tie bars 108 and 111 are generally used to support the die attach pad 107 and contacts 109, respectively. The contacts 109 are generally attached to the tie bars 111 by tie bar stubs 112.

During assembly, dice are attached to the respective die attach pads 107. Conventional wire bonding is used to electrically couple bond pads on each die to their associated contacts 109 on the lead frame strip 101. After the wire bonding, a plastic cap is molded over the top surface of each array 103 of wire-bonded dice. The dice are generally then singulated and tested using conventional sawing and testing techniques.

Since leadless lead frame packaging has proven to be a cost effective packaging arrangement, there are continuing efforts to provide further improvements to the package structure and/or processing, to permit the package style to be used in additional applications and/or to improve specific characteristics of the resultant devices.

SUMMARY OF THE INVENTION

To achieve the foregoing and other objects of the invention, methods of fabricating leadless packages are described that facilitate increased contact density. In most respects, the packages may be fabricated in a manner similar to current lead frame based leadless packaging techniques. By way of example, a lead frame panel may be patterned to define a plurality of device areas and a matrix of tie bars. Each device area includes a die attach pad and a multiplicity of conductive contacts. The contacts may each be attached to an associated tic bar by a tie bar stub. In the present invention, the die attach pad is supported by the contacts. In a preferred embodiment, the die attach pad is carried by support bars that extend from selected contacts. The use of die attach pad support bars eliminates the need for separate tie bars to support the die attach pad during fabrication thus increasing the available space for additional contacts. In one embodiment of the invention, the support bars are narrower than their corresponding contacts while in other embodiments the support bars are equal to or wider than their corresponding contacts.

During assembly, the lead frame panel is held in position by vacuum or any other suitable means while the die attach pad support bars are severed. The position holding device may be an integrated part of existing taping machinery, or may stand alone as a separate fixture. Severing the die attach pad support bars may be accomplished in any of a number of manners well known in the art including, but not limited to, punching, stamping, sawing, laser cutting, or etching. Once the die attach pad support bars are severed, an adhesive tape is adhered to the exposed surface of the lead frame panel so that the die attach pad may be held in a fixed position relative to its associated contacts.

After the adhesive tape has been applied, the packages may be assembled in any appropriate manner. By way of example, dice may be attached to the die attach pads and electrically connected to the contacts (e.g., by wire bonding). Thereafter, a casing is molded or otherwise provided that encapsulates the die and connectors while leaving the bottom surfaces of the contacts exposed. After the encapsulation, device areas are singulated into individual units. This method may be applied equally to both one-dimensional arrays of device areas as well as to two-dimensional arrays of device areas.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE DRAWINGS

A number of improvements to leadless package designs are described below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
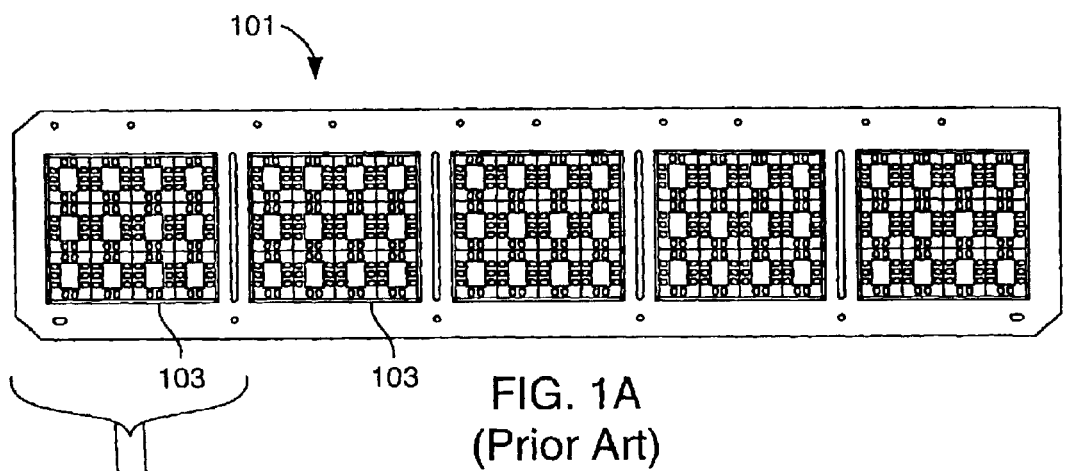
FIGS. 1A–1C diagrammatically illustrate a lead frame strip suitable for use in forming leadless lead frame packages.
Figure 1B:
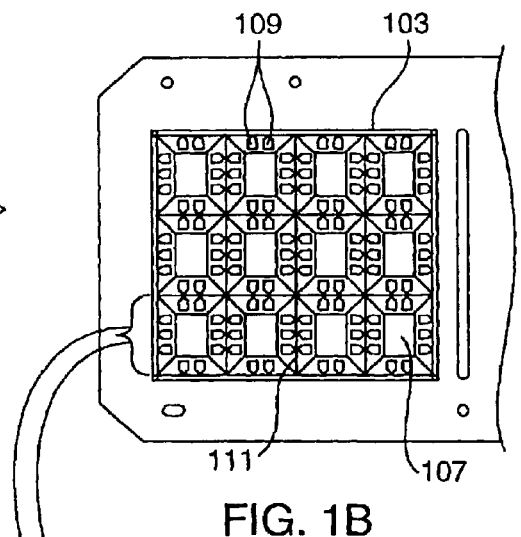
Figure 1C:
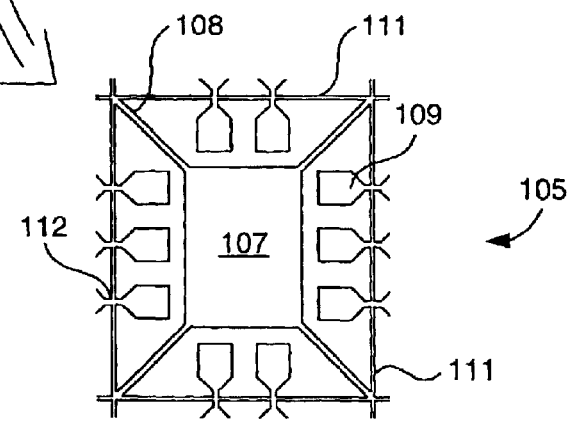
Figure 2A:
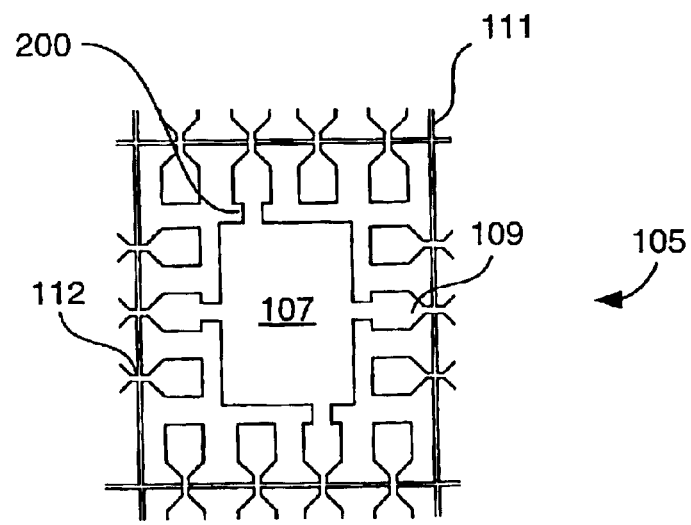
FIG. 2A diagrammatically illustrates a device area in accordance with one embodiment of the present invention wherein the die attach pad is supported by support bars that extend from the contacts.

FIG. 2A diagrammatically illustrates a device area 105 in accordance with one embodiment of the present invention wherein a die attach pad 107 is supported by support bars 200 that extend from contacts 109. The device area 105 represents a section of a lead frame panel (such as the lead frame panel illustrated in FIG. 1). The lead frame panel may be fabricated using conventional techniques including photolithography, stamping, etching, or cutting. As can be appreciated by one skilled in the art, it is sometimes desirable to increase the density of the contacts corresponding to a particular device area. The increased density of contacts allows the manufacturer to more flexibly configure a device area and its resulting package, which in turn imparts greater efficiency to semiconductor process manufacturing. It should be noted that, although the support bars 200 are represented as narrower than the contacts 109, they might be as wide as or wider than the contacts 109.

Figure 2B:
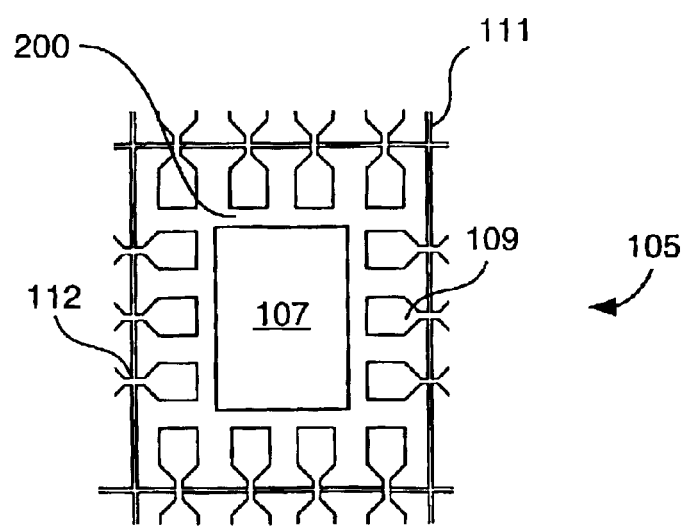
FIG. 2B illustrates the device area of FIG. 2A after the support bars have been removed.

FIG. 2B illustrates the device area of FIG. 2A after the support bars 200 have been removed. Removal of the support bars 200 may be accomplished by any of the following means without limitation: punching, sawing, laser cutting, or etching. The configuration of the contacts 109 are arranged such that sawing the support bars 200 will not damage the contacts 109 or the die attach pad 107. An advantage of the present invention is that the die attach pad 107 is electrically isolated from its corresponding contacts 109 early in the manufacturing process. The method or steps to accomplish the present invention will be examined at length in the following discussion.

Figure 3:
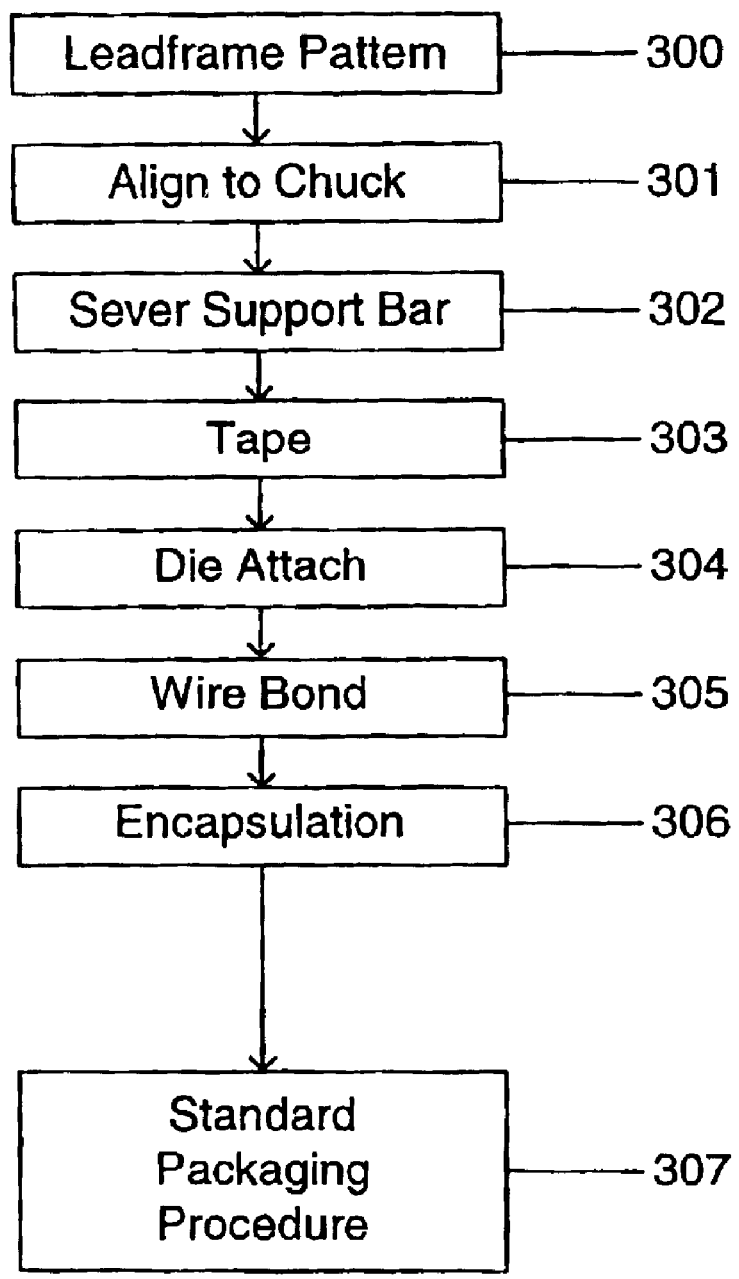
FIG. 3 is a flow chart illustrating a modified packaging process in accordance with an embodiment of the present invention.

FIG. 3 is a flow chart illustrating a modified packaging process in accordance with an embodiment of the present invention. A lead frame panel 101 is provided (step 300) wherein the lead frame is patterned such that the die attach pad 107 is supported by support bars 200 which are in turn connected to the contacts 109 as illustrated in FIG. 2A. As will be appreciated by one skilled in the art, the lead frame panel 101 may be arranged in either a one-dimensional or two-dimensional array of device areas. Once the lead frame panel 101 is ready for production, it is attached or secured to a holding platform or chuck (step 301). The holding platform 401 must not only secure the lead frame panel 101, but must also insure the precise alignment of the die attach pad 107 to the contacts 109 subsequent to severing the support bar in step 302. Attaching or anchoring the lead frame panel 101 is accomplished using a partial vacuum across the surface of the holding platform. It should be appreciated that tolerances between the die attach pads 107 and the contacts 109 are critical and that the holding platform 401 must hold the lead frame panel 101 stable during severance as well as during the taping operation (step 303) that follows.

Once the support bars 200 have been severed (step 302), the die attach pad 107 and the lead frame panel 101 must be secured in such a way as to preserve the relative position of the die attach pad 107 to its associated contacts 109. According to one embodiment of the present invention, an adhesive tape may be adhered (step 303) to the exposed surface of the lead frame panel 101. The tape allows the lead frame panel 101 to be removed from the chuck and further processed. The tape must not only secure the lead frame panel 101 firmly during processing, but must release the panel without disturbing the encapsulating material that holds the contacts in place later in the packaging process. After the tape has been adhered to the lead frame panel 101, dice are attached to the die attach pads (step 304), wire bonded to the contacts (step 305), encapsulated in molding material (step 306), and packaged according to conventional methods (step 307).

Figure 4A:
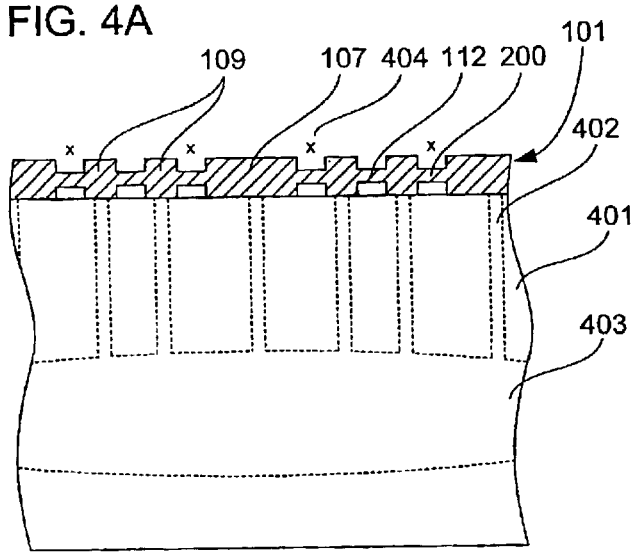
FIG. 4A is a diagrammatic cross-sectional side view of a segment of a lead frame panel mounted on a holding platform in accordance with an embodiment of the present invention.
Figure 4B:
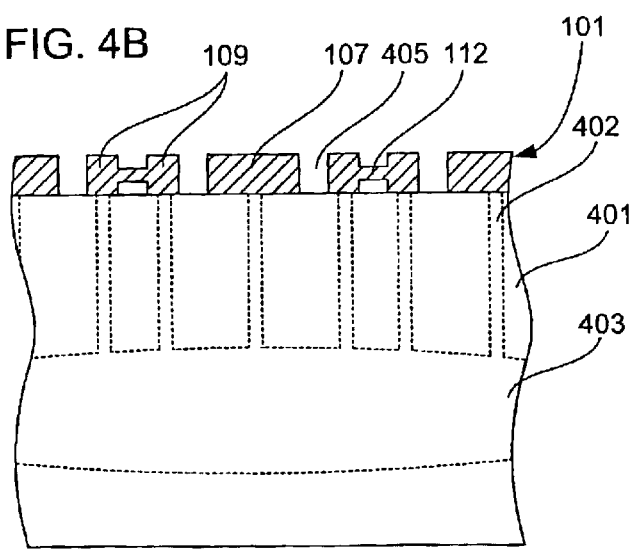
FIG. 4B is a diagrammatic cross-sectional side view of the lead frame panel segment of FIG. 4A mounted on a holding platform wherein the die attach pads have been separated from their corresponding contacts in accordance with an embodiment of the present invention
Figure 4C:
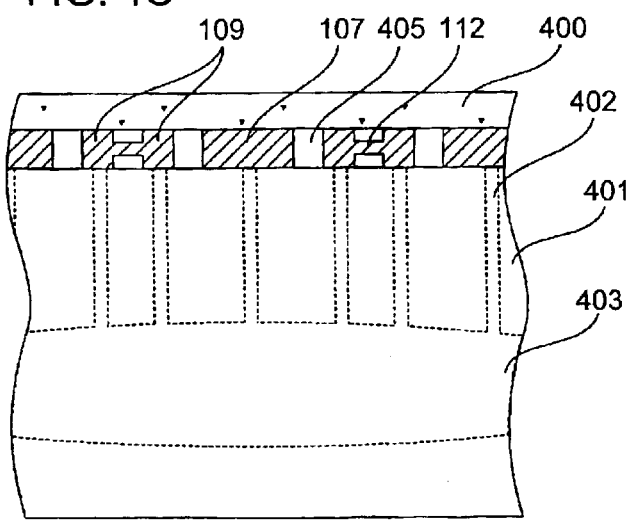
FIG. 4C is a diagrammatic cross-sectional side view of the lead frame panel segment of FIG. 4B mounted on a holding platform wherein the die attach pads have been separated from their corresponding contacts and wherein an adhesive tape has been attached to the surface of the lead frame panel in accordance with an embodiment of the present invention.

Referring next to FIGS. 4A–C are diagrammatic cross-sectional side views of the present invention in three separate steps of the process. FIG. 4A is a diagrammatic cross-sectional side view of a lead frame panel 101 mounted on a holding platform 401 in accordance with an embodiment of the present invention. As illustrated, the die attach pads 107 are supported by support bars 200, which are connected to the contacts 109. To avoid confusion, an "x" 404 demarks and draws attention to the support bars 200 which will be severed in a following step. The lead frame panel 101 is secured to the holding platform 401 by applying vacuum across the surface of the holding platform through ducts or channels 402. A vacuum source 403 supplies sufficient vacuum to hold the lead frame panel 101 in place during severance without distorting the lead frame panel 101. As can be appreciated by one skilled in the art, the channels 402 and the vacuum supply 403 are shown by way of example only and do not represent the sole method of securing the lead frame panel 101.

FIG. 4B is a diagrammatic cross-sectional side view of a lead frame panel 101 mounted on a holding platform 401 wherein the die attach pad 107 has been separated from its corresponding contacts 109 in accordance with an embodiment of the present invention. Severing the support bars 200 may be accomplished in any of the following methods including punching, etching, stamping, sawing, or otherwise cutting. In FIG. 4B, the die attach pad 107 has been electrically and physically isolated from its corresponding contacts 109 and the lead frame panel 101. The die attach pad 107 is held in its relative position to the contacts 109 during severance and taping. As will be appreciated in the art, a variety of techniques or combinations thereof may also be applied to secure the lead frame panel 101 including adhering and clamping the lead frame panel 101 to the holding platform 401.

Referring next to FIG. 4C is a diagrammatic cross-sectional side view of a lead frame panel 101 mounted on a holding platform wherein the die attach pad 107 has been separated from its corresponding contacts 109 and wherein an adhesive tape 400 has been attached to the surface of the lead frame panel 101 in accordance with an embodiment of the present invention. In order to safely remove the lead frame panel 101 and the now unattached die attach pads 107 from the holding platform 401 while maintaining the correct positioning of the component parts, an adhesive tape 400 is adhered to the exposed surface of the lead frame panel 101 and the die attach pad 107. The tape must adhere well enough to hold the component parts in position as well as release easily enough so that the die attach pads 107 and the contacts 109 are not disturbed in the encapsulating material that ultimately holds the finished package together. It is desirable to accomplish the severance of the support bars 200 and application of the adhesive tape 400 without moving the lead frame panel 101 to minimize the risk of misaligning the die attach pads 107. Accordingly, it would be desirable to either modify an existing severance machine to allow subsequent taping, or to modify an existing taping machine to allow severance. Both solutions are contemplated by the invention described herein.

A number of conventional package processing techniques have been described as being used to accomplish specific steps in the formation of the described devices. It should be apparent that in most cases these processing techniques can be widely varied and a wide variety of alternative conventional processes may be used in their place. Accordingly, the present examples are to be considered as illustrative and not restrictive, and the invention is not to be limited to the details given herein, but may be modified within the scope of the appended claims.

What is claimed is:

1. A method of packaging semiconductor devices comprising:

providing a lead frame panel patterned to define a plurality of device areas, each device area including a multiplicity of conductive contacts and a die attach pad, wherein the die attach pad is carried by support bars that extend from a plurality of the contacts;

severing the support bars that carry the die attach pad while holding the lead frame panel and the die attach pads in place;

adhering an adhesive tape to the bottom surface of the lead frame panel after the severing and while still holding the lead frame panel and the die attach pads in place such that the lead frame panel and the die attach pads are secured in their relative positions;

mounting a plurality of dice onto the die attach pads, wherein each die is mounted onto an associated die attach pad;

electrically connecting each die to the contacts of an associated device area; and forming a casing over the die and the contacts while leaving bottom surfaces of the contacts and the die attach pad exposed at a bottom surface of the package, wherein material that forms the casing is also exposed on the bottom surface of the package and is substantially co-planer with the bottom surfaces of the contacts wherein the casing isolates the contacts from each other.

2. A method as recited in claim 1 wherein the lead frame and the die attach pads are held in place at least in part by a vacuum.

3. A method as recited in claim 1 wherein the lead frame and the die attach pads are held in place by a mechanism that is part of a taping machine that applies the adhesive tape to the lead frame panel.

4. A method as recited in claim 1 wherein severing the support bars is accomplished by one of the group consisting of punching, sawing, laser cutting, or etching.

5. A method of packaging semiconductor devices comprising:

providing a lead frame panel patterned to define at least one two-dimensional array of devices, each device area including a multiplicity of conductive contacts and a die attach pad, wherein the die attach pad is carried by support bars that extend from a plurality of the contacts;

severing the support bars that carry the die attach pad while holding the lead frame panel and the die attach pads in place;

adhering an adhesive tape to the bottom surface of the lead frame panel after the severing such that the lead frame panel and the die attach pads are secured in their relative positions;

mounting a plurality of dice onto the die attach pads, wherein each die is mounted onto an associated die attach pad;

electrically connecting each die to the contacts of an associated device area; and forming a casing over the die and the contacts while leaving bottom surfaces of the contacts and the die attach pad exposed at a bottom surface of the package, wherein material that forms the casing is also exposed on the bottom surface of the package and is substantially co-planer with the bottom surfaces of the contacts wherein the casing isolates the contacts from each other.

6. A method as recited in claim 5 wherein the lead frame and the die attach pads are held in place at least in part by a vacuum.

7. A method as recited in claim 5 wherein the lead frame and the die attach pads are held in place by a mechanism that is part of a taping machine that applies the adhesive tape to the lead frame panel.

8. A method as recited in claim 5 wherein severing the support bars is accomplished by one of the group consisting of punching, sawing, laser cutting, or etching.

* * * * *